US008679642B2

(12) United States Patent
Smith et al.

(10) Patent No.: US 8,679,642 B2
(45) Date of Patent: Mar. 25, 2014

(54) SYSTEM FOR REPAIRING CRACKS IN STRUCTURES

(71) Applicant: The United States of America as represented by the Administrator of the National Aeronautics and Space Administration, Washington, DC (US)

(72) Inventors: Stephen W. Smith, Williamsburg, VA (US); John A. Newman, Yorktown, VA (US); Robert S. Piascik, Williamsburg, VA (US); Edward H. Glaessgen, Yorktown, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 14/037,850

(22) Filed: Sep. 26, 2013

(65) Prior Publication Data

US 2014/0030543 A1 Jan. 30, 2014

Related U.S. Application Data

(62) Division of application No. 13/719,740, filed on Dec. 19, 2012, which is a division of application No. 12/849,906, filed on Aug. 4, 2010, now Pat. No. 8,347,479.

(60) Provisional application No. 61/231,056, filed on Aug. 4, 2009.

(51) Int. Cl.
*B32B 15/00* (2006.01)
*B32B 3/30* (2006.01)

(52) U.S. Cl.
USPC ........... 428/609; 428/612; 428/642; 428/646; 428/650; 428/660

(58) Field of Classification Search
None
See application file for complete search history.

(56) References Cited

U.S. PATENT DOCUMENTS

| 2,086,166 | A | * | 7/1937 | Kronquest | 29/527.2 |
| 3,097,965 | A | * | 7/1963 | Wilkins | 428/621 |
| 4,775,602 | A | * | 10/1988 | Rasch | 428/668 |
| 5,482,090 | A | * | 1/1996 | Yamanashi | 138/171 |
| 6,063,514 | A | * | 5/2000 | Nishioka et al. | 428/698 |
| 6,075,072 | A | * | 6/2000 | Guilbert et al. | 523/200 |
| 6,257,762 | B1 | * | 7/2001 | Guzik | 378/203 |
| 6,274,193 | B1 | * | 8/2001 | Rigney et al. | 427/142 |
| 6,321,930 | B1 | * | 11/2001 | Franklin et al. | 220/678 |
| 6,322,730 | B1 | * | 11/2001 | Wachtler | 264/36.22 |
| 6,454,885 | B1 | * | 9/2002 | Chesnes et al. | 148/528 |
| 6,774,339 | B1 | * | 8/2004 | Smathers et al. | 219/121.66 |
| 8,236,088 | B2 | * | 8/2012 | Hasegawa et al. | 75/252 |

(Continued)

FOREIGN PATENT DOCUMENTS

| JP | 64-9022 | * | 1/1989 |
| JP | 11-43706 | * | 2/1999 |
| JP | 2003-56359 | * | 2/2003 |

*Primary Examiner* — John J Zimmerman
(74) *Attorney, Agent, or Firm* — Robin W. Edwards

(57) ABSTRACT

A first material with a known maximum temperature of operation is coated with a second material on at least one surface of the first material. The coating has a melting temperature that is greater than the maximum temperature of operation of the first material. The coating is heated to its melting temperature until the coating flows into any cracks in the first material's surface.

5 Claims, 1 Drawing Sheet

(56) References Cited

U.S. PATENT DOCUMENTS

| | | | |
|---|---|---|---|
| 8,347,479 B2* | 1/2013 | Smith et al. | 29/402.01 |
| 2004/0050913 A1* | 3/2004 | Philip | 228/194 |
| 2005/0241934 A1* | 11/2005 | Sauvant-Moynot et al. | 204/196.37 |
| 2006/0078432 A1* | 4/2006 | Darolia et al. | 416/241 R |
| 2006/0117562 A1* | 6/2006 | Subramanian et al. | 29/889.1 |
| 2007/0048537 A1* | 3/2007 | Knoedler et al. | 428/471 |
| 2007/0175546 A1* | 8/2007 | Hoppe et al. | 148/428 |
| 2007/0221631 A1* | 9/2007 | Ruokolainen et al. | 219/121.11 |
| 2007/0231156 A1* | 10/2007 | Hong | 416/241 R |
| 2009/0280023 A1* | 11/2009 | Hu | 420/445 |
| 2010/0136254 A1* | 6/2010 | Darolia et al. | 427/534 |
| 2010/0270276 A1* | 10/2010 | Cookson et al. | 219/121.66 |
| 2010/0297345 A1* | 11/2010 | Jensen et al. | 427/142 |
| 2011/0033721 A1* | 2/2011 | Rohatgi | 428/548 |
| 2012/0058004 A1* | 3/2012 | Hasegawa et al. | 420/453 |
| 2012/0160361 A1* | 6/2012 | Fischer et al. | 138/145 |

* cited by examiner

SYSTEM FOR REPAIRING CRACKS IN STRUCTURES

CROSS-REFERENCE TO RELATED APPLICATIONS

This application claims the benefit of priority to and is a divisional of U.S. patent application Ser. No. 13/719,740, filed on Dec. 19, 2012, which claims the benefit of priority to U.S. patent application Ser. No. 12/849,906, filed on Aug. 4, 2010 (now U.S. Pat. No. 8,347,479), which claims the benefit of priority to U.S. Provisional Patent Application No. 61/231,056, filed on Aug. 4, 2009. The contents of each of the foregoing applications are hereby incorporated by reference in their entireties.

ORIGIN OF THE INVENTION

This invention was made by employees of the United States Government and may be manufactured and used by or for the Government of the United States of America for governmental purposes without the payment of any royalties thereon or therefor.

BACKGROUND OF THE INVENTION

1. Field of the Invention

This invention relates to structural repair methods. More specifically, the invention is a system for repairing cracks found in structures.

2. Description of the Related Art

The root cause of metallic-structural fatigue failure is the initiation and propagation of cracks. Typically, cracks start at local regions of high stress (e.g., bolt holes, corners, etc.) or at microscopic defects inherent in the material (e.g., voids, particles, etc.). To assure that structures (e.g., buildings, bridges, airplanes, aerospace vehicles, etc.) remain operationally safe, routine crack inspection and crack repair programs are utilized. These programs typically consist of the following steps:

determining a safe level of crack damage based on fracture mechanics concepts;

inspecting a structure to insure that the damage state is acceptable; and repairing the structure before the crack damage exceeds safe levels.

Current research in this field has focused on refining the criteria that defines safe crack levels and improving damage monitoring methods/systems (i.e., a field that has come to be known as "structural health monitoring"). However, when it comes to repairing cracks in structures, the approaches vary widely and are generally industry specific, thereby leading to varying degrees of confidence in crack repairs.

SUMMARY OF THE INVENTION

Accordingly, it is an object of the present invention to provide a method and system for repairing cracks in structural materials.

Another object of the present invention is to provide a method of repairing cracks in metallic structures, Still another object of the present invention is to provide a method of repairing cracks in metallic structures that can be readily applied to a wide variety of existing structures and those being fabricated.

Other objects and advantages of the present invention will become more obvious hereinafter in the specification and drawings.

In accordance with the present invention, a crack repairable system and method of repairing cracks is provided. A first material with a known maximum temperature of operation is coated with a second material on at least one surface of the first material. The coating has a melting temperature that is greater than the maximum temperature of operation of the first material. The second material/coating is heated to its melting temperature until the coating flows into any cracks that might be present in the first material's surface.

DETAILED DESCRIPTION OF THE INVENTION

Figure 1:
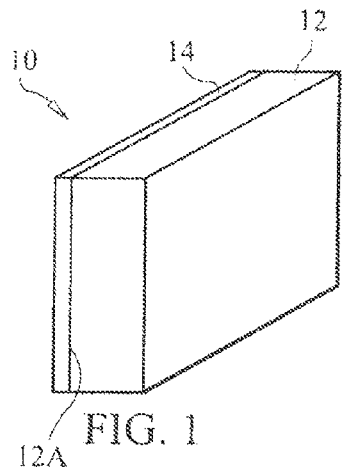
FIG. 1 is a perspective view of a portion of a metallic material/structure coated on one side thereof to form a crack repairable system in accordance with an embodiment of the present invention.

Referring now to the drawings and more particularly to FIG. 1, a crack repairable material system that is or will be part of a structure is referenced by numeral 10. It is to be understood that the material system 10 is representative of either a system that is to be fabricated into a structural element, a portion of a structural element that is to become part of a fabricated structure, or a new or existing part of a fabricated structure, without departing from the scope of the present invention.

Material system 10 includes a base material 12 that defines the structural part of material system 10 selected/designed for a particular application. For example, in aerospace applications, base material 12 is generally selected to be an aerospace structural alloy such as a titanium alloy (e.g., Ti-6Al-4V, Ti21S, etc.) or an aluminum alloy (e.g., AA. 2024, AA 7075, etc.). Base material 12 could also be a metallic component, a metallic face sheet, or even a fiber metal laminate.

A surface 12A of a base material 12 is coated with one or more layers of a crack repair coating 14. The number of layers, choice of material for coating 14, and method of applying same to surface 12A can be selected to suit a particular application. Again, in the aerospace application example where base material 12 is a titanium or aluminum alloy, coating 14 can be a low melting temperature eutectic alloy as will be explained further below. The one or more layers of coating 14 could be applied using various coating methodologies such as vapor deposition, sputtering, evaporation, etc.

The selection of crack repair coating 14 is predicated on the operating temperature of base material 12 and the aging criteria temperature of base material 12. As used herein, the "aging criteria temperature" of a material/structure can be defined simply as the temperature at which a material's or structure's properties are affected to the point that their function is degraded. However, it is to be understood that a material's aging criteria temperature can also have a time component associated therewith. That is, a material's aging criteria temperature can be affected (e.g., lowered) by the duration of heat exposure and/or the number of occurrences of heat exposure at a temperature that will cause material properties/function to degrade. Note that in accordance with good design practices, the maximum operating temperature of base material 12 will generally be less than the temperature defined by the aging criteria temperature of base material 12.

In accordance with the present invention, coating 14 must be able to withstand (i.e., not breakdown, melt, etc.) the maximum operating temperature that base material 12 is expected to encounter during its useful service life in an application. As the same time, coating 14 must be able to melt and flow at a temperature that is greater than the above-noted maximum operating temperature of base material 12. For many applications, the melt/flow temperature of coating 14 will also be less than the aging criteria temperature of base material 12, although it may be possible to exceed the aging criteria temperature for brief periods of time without damaging base material 12. For a base material 12 made from the above-mentioned titanium and aluminum alloys, coating 14 can be made from a low melting temperature eutectic alloy such as indium and tin, the formulation of which can be adjusted to satisfy the above-described temperature criteria for a particular application.

Figure 2:
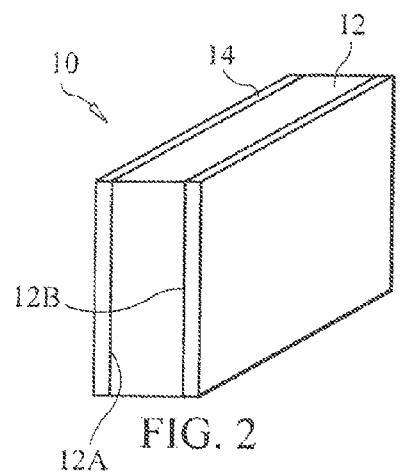
FIG. 2 is a perspective view of a portion of a metallic material/structure coated on opposing sides thereof to form a crack repairable system in accordance with another embodiment of the present invention.

The present invention is not limited to the coating of a single surface of the base material. Accordingly, FIG. 2 illustrates base material 12 with crack repair coating 14 on opposing surfaces 12A, 12B of base material 12. In general, any surface of base material 12 could be coated with crack repair coating 14. Further, the number of layers, thickness, and even formulations of coating 14 could be varied across base material 12 without departing from the scope of the present invention.

Figure 3:
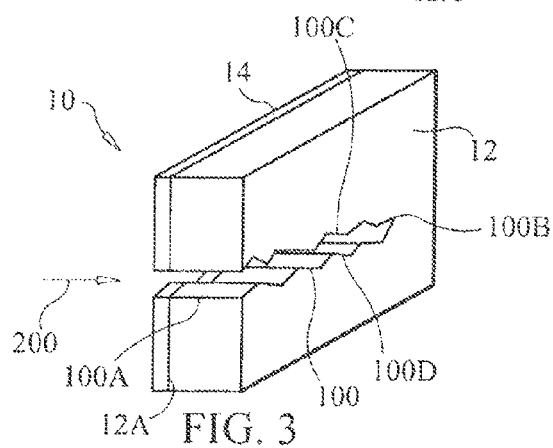
FIG. 3 is a perspective view of the metallic material/structure from FIG. 1 with a crack formed therein.
Figure 4:
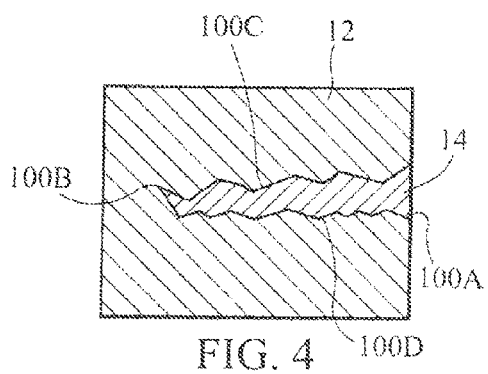
FIG. 4 is a cross-sectional view of the metallic material/structure illustrating a complete filling of the crack after repairing in accordance with the present invention.
Figure 5:
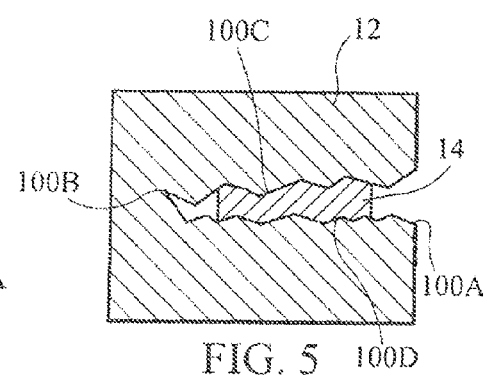
FIG. 5 is a cross-sectional view of the metallic material/structure illustrating a partial filling of the crack after repairing in accordance with the present invention.

Referring now to FIGS. 3-5, crack repair in accordance with the present invention will be explained. By way of example, material system 10 (FIG. 1) is illustrated with a crack 100 formed therein. In most instances, crack 100 will extend through coating 14. The mouth of crack 100 is indicated at 100A and its tip is indicated at 100E. Opposing faces of crack 100 are indicated at 100C and 100D.

Prior to the repair of crack 100 in accordance with the present invention, material system 10 will generally be subjected to an inspection in order to detect crack 100. Accordingly, the crack repair methodology of the present invention can include inspection (e.g., periodically) of material system 10. The particular choice of inspection system/method is not a limitation of the present invention. Furthermore, it is to be understood that an inspection process is not a requirement of the present invention. That is, the crack repair process of the present invention could be implemented automatically, periodically, etc., without ever inspecting for cracks.

Once crack 100 is detected (or at some predetermined time if no inspection process is employed), the repair of crack 100 is initiated through the application of heat referenced by arrow 200. More specifically, heat 200 must be sufficient to raise coating 14 to its melting temperature so that it can begin to flow. However, heat 200 should not raise the temperature of base material 12 above its aging criteria temperature for any amounts of time that might lead to degradation of base material 12. Heat 200 can be applied "globally" across all of material system 10, but it may be more practical to apply heat 200 "locally" in the proximity of crack 100.

As coating 24 melts and flows, it will completely or at least partially fill crack 100 as illustrated respectively in FIGS. 4 and 5. Ideally, coating 14 completely fills crack 10 from its mouth 100A to its tip 100B as shown in FIG. 4. However, depending on the size of crack 100 and the viscosity of coating 14 when melted, crack 100 may only be partially filled as shown in FIG. 5. In either case, with crack 100 so filled, heat 200 is removed and coating 14 is allowed to cool and harden. As this is occurring, coating 14 adheres to opposing faces 100C and 100D thereby bridging across crack 100. By filling crack 100, load transfer across material system 10 occurs through coating 14 and the force experienced by crack 100 is reduced. Furthermore, when the structure embodying material system 10 is unloaded such that crack 100 experiences decreasing loads, coating 14 acts to close opposing crack surfaces 100C and 100D to thereby eliminate the stress at crack tip 100B.

Note that even if the crack bridging mechanism fails (i.e., coating 14 no longer adheres to opposing crack faces 100C and 100D) after a period of time, the crack closure mechanism will remain.

The advantages of the present invention are numerous. A material/structure is made crack repairable by a coating that can be heated to its melt/flow temperature without adversely affecting the behavior of the underlying structure. The process of heating the coating in proximity to any cracks can be repeated periodically as part of a structure's regular maintenance program. The process/system can be implemented on existing completed structures and during a structure's assembly/fabrication. The heat needed for repairs could be applied by an external source or one built into a structure. The process/system will be particularly useful as part of an overall health monitoring system for airplanes and aerospace vehicles.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. A crack repaired and crack repairable system, comprising:
   a metallic structure made from a material selected from the group consisting of titanium alloys and aluminum alloys, said metallic structure having a surface with at least one crack formed therein wherein each said crack defines opposing surfaces within said metallic structure; and
   a crack repair material made from a eutectic alloy of indium and tin, said crack repair material at least partially filling each said crack and in contact with said opposing surfaces thereof, said crack repair material further coating at least one surface of said metallic structure.

2. A crack repaired and crack repairable system as in claim 1, wherein said crack repair material adheres to said opposing surfaces of each said crack.

3. A crack repaired and crack repairable system as in claim 1, wherein said crack repair material fills each said crack up to said surface of said metallic structure.

4. A crack repaired and crack repairable system as in claim 1, wherein layers of said crack repair material coat said surface of said metallic structure.

5. A crack repaired and crack repairable system as in claim 1, wherein said metallic structure has a second surface opposing said surface, said system further comprising at least one layer of said crack repair material coating said second surface.

* * * * *